(12) United States Patent
Oda et al.

(10) Patent No.: US 11,309,643 B2
(45) Date of Patent: Apr. 19, 2022

(54) SUBSTRATE CONNECTING STRUCTURE

(71) Applicant: JTEKT CORPORATION, Osaka (JP)

(72) Inventors: Masato Oda, Okazaki (JP); Yuto Sato, Nagoya (JP)

(73) Assignee: JTEKT CORPORATION, Osaka (JP)

(*) Notice: Subject to any disclaimer, the term of this patent is extended or adjusted under 35 U.S.C. 154(b) by 0 days.

(21) Appl. No.: 17/038,712

(22) Filed: Sep. 30, 2020

(65) Prior Publication Data
US 2021/0111501 A1 Apr. 15, 2021

(30) Foreign Application Priority Data
Oct. 11, 2019 (JP) .............................. JP2019-187919

(51) Int. Cl.
| | |
|---|---|
| *H01R 12/52* | (2011.01) |
| *H01R 12/58* | (2011.01) |
| *H01R 13/05* | (2006.01) |
| *H05K 5/00* | (2006.01) |
| *H02K 11/33* | (2016.01) |
| *H02K 5/22* | (2006.01) |

(52) U.S. Cl.
CPC ........... *H01R 12/523* (2013.01); *H01R 12/58* (2013.01); *H01R 13/05* (2013.01); *H05K 5/0069* (2013.01); *H02K 5/225* (2013.01); *H02K 11/33* (2016.01)

(58) Field of Classification Search
CPC ...... H01R 12/523; H01R 12/58; H01R 13/05; H05K 5/0069; H05K 1/144; H05K 2201/09063; H02K 11/33; H02K 5/225
See application file for complete search history.

(56) References Cited

U.S. PATENT DOCUMENTS

| | | | | |
|---|---|---|---|---|
| 5,122,066 A | * | 6/1992 | Plossmer ............... | H01R 13/111 439/246 |
| 5,249,973 A | * | 10/1993 | Fujita ................... | H01R 9/2466 439/328 |
| 6,984,133 B2 | * | 1/2006 | Naitou ................... | H05K 1/144 439/76.2 |

(Continued)

FOREIGN PATENT DOCUMENTS

| | | |
|---|---|---|
| CN | 204558657 U | 8/2015 |
| DE | 102018204297 A1 | 9/2019 |

(Continued)

OTHER PUBLICATIONS

Mar. 1, 2021 Search Report issued in European Patent Application No. 20200770.4.

*Primary Examiner* — Oscar C Jimenez
*Assistant Examiner* — Paul D Baillargeon
(74) *Attorney, Agent, or Firm* — Oliff PLC

(57) ABSTRACT

A substrate connecting structure includes a first substrate, a second substrate facing the first substrate, and a terminal through which electricity is supplied to the first substrate and the second substrate. The terminal has a first substrate connecting part that is connected to the first substrate from a side opposite from the second substrate, and a second substrate connecting part that is provided by splitting from the first substrate connecting part at an intermediate point in the terminal and connected to the second substrate by extending contactlessly through the first substrate from the side opposite from the second substrate toward the second substrate.

6 Claims, 4 Drawing Sheets

(56) References Cited

U.S. PATENT DOCUMENTS

| | | | | |
|---|---|---|---|---|
| 7,503,767 B2* | 3/2009 | Pai | ........................ | H05K 1/144 |
| | | | | 439/66 |
| 8,690,586 B2* | 4/2014 | Schneider | .............. | H01R 12/91 |
| | | | | 439/66 |
| 2005/0082835 A1 | 4/2005 | Shimoyama et al. | | |

FOREIGN PATENT DOCUMENTS

| | | |
|---|---|---|
| EP | 3525336 A1 | 8/2019 |
| JP | 2017-033876 A | 2/2017 |
| JP | 2018-207640 A | 12/2018 |

* cited by examiner

SUBSTRATE CONNECTING STRUCTURE

CROSS-REFERENCE TO RELATED APPLICATION

This application claims priority to Japanese Patent Application No. 2019-187919 filed on Oct. 11, 2019, incorporated herein by reference in its entirety.

BACKGROUND

1. Technical Field

The present disclosure relates to a substrate connecting structure.

2. Description of Related Art

There is a motor device in which a motor and a controller thereof are integrally provided. For example, the controller of the motor device of Japanese Patent Application Publication No. 2018-207640 (JP 2018-207640 A) has a power substrate and a control substrate. The power substrate is provided with an inverter circuit that supplies electricity to a coil of the motor. The control substrate is provided with a control circuit that controls a current supplied by the inverter circuit. The power substrate and the control substrate are provided orthogonal to an axial direction of the motor. The power substrate is located closer to the motor than the control substrate is.

SUMMARY

In the controller of JP 2018-207640 A, a power supply voltage is supplied to the power substrate through a power supply terminal of a connector. The power supply voltage supplied to the power substrate is then supplied to the control substrate through an inter-substrate connector. Thus, the power supply voltage is supplied to the control substrate via the power supply terminal, the power substrate, and the inter-substrate connector. As a result, the power supply distance from the power source to the control substrate tends to be longer. As the power supply distance becomes longer, the value of electrical resistance becomes larger and therefore the transmission efficiency of the power supply voltage from the power source to the control substrate decreases.

The present disclosure provides a substrate connecting structure that allows electricity to be supplied to a substrate more efficiently.

A substrate connecting structure according to an aspect of the present disclosure includes a first substrate, a second substrate facing the first substrate, and a terminal through which electricity is supplied to the first substrate and the second substrate. The terminal has a first substrate connecting part that is connected to the first substrate from a side opposite from the second substrate, and a second substrate connecting part that is provided by splitting from the first substrate connecting part at an intermediate point in the terminal and connected to the second substrate by extending contactlessly through the first substrate from the side opposite from the second substrate toward the second substrate.

In this aspect, electricity is directly supplied to each of the first substrate and the second substrate through the terminal. Thus, the power supply distance to the first substrate is reduced compared with when, for example, a configuration in which electricity is supplied to the first substrate through the second substrate is employed. As the power supply distance is reduced, the value of electrical resistance decreases accordingly. Therefore, the power transmission efficiency can be increased.

In the above aspect, the first substrate connecting part and the second substrate connecting part may extend along a direction in which the first substrate and the second substrate face each other. In this configuration, the first substrate connecting part is connected to the first substrate in a direction orthogonal to the first substrate. The second substrate connecting part is connected to the second substrate in a direction orthogonal to the second substrate. This makes it basically unnecessary for the first substrate connecting part and the second substrate connecting part to have portions that extend along the first substrate and the second substrate. Thus, the power supply distance can be further reduced.

In the above aspect, of the first substrate connecting part and the second substrate connecting part, at least the first substrate connecting part may be provided with a low-rigidity portion.

Depending on factors such as the environment where the substrate connecting structure is installed or used, the ambient temperature of the substrate connecting structure may change significantly. When the substrate connecting structure is repeatedly subjected to a rapid temperature change, the following phenomenon may occur in an area where parts with different coefficients of thermal expansion are joined together, in particular, an area where the first substrate and the first substrate connecting part that is shorter than the second substrate connecting part are joined together: When the first substrate connecting part and the first substrate expand and contract accompanying repeated rapid temperature changes, stress acts on their joint area due to the difference in the rate of expansion between the first substrate connecting part and the first substrate, which may make it difficult to keep the first substrate connecting part and the first substrate in an appropriately joined state.

In this regard, in the above configuration, at least the first substrate connecting part is provided with the low-rigidity portion to reduce the rigidity of the first substrate connecting part. Thus, the first substrate connecting part deforms more easily. As expansion and contraction of the first substrate connecting part are absorbed through deformation of the first substrate connecting part, stress acting on the joint area of the first substrate connecting part and the first substrate is relieved.

Stress associated with repeated rapid temperature changes acts also on the joint area of the second substrate connecting part and the second substrate. However, being longer than the first substrate connecting part, the second substrate connecting part deforms more easily than the first substrate connecting part. Therefore, although it depends on the length of the second substrate connecting part, it is not absolutely necessary to provide the second substrate connecting part with a structure for reducing its rigidity.

In the above configuration, the width of the first substrate connecting part connected to the first substrate may be smaller than the width of the second substrate connecting part connected to the second substrate, and the first substrate connecting part may be provided with, as the low-rigidity portion, a serpentine portion that is a portion meandering alternately in opposite directions.

It is possible to reduce the rigidity of the first substrate connecting part by, for example, setting the width of the first substrate connecting part smaller, but there is a limit to reducing the width. In this regard, when the first substrate connecting part is provided with the serpentine portion as in the above configuration, the rigidity of the first substrate connecting part can be reduced without the width thereof being set smaller. Thus, the first substrate connecting part deforms more easily.

In the above configuration, the second substrate connecting part may be provided with, as the low-rigidity portion, a small-width portion that is a portion at which the width of the second substrate connecting part is set smaller. In this configuration, the second substrate connecting part is provided with the small-width portion to reduce the rigidity of the second substrate connecting part. Thus, the second substrate connecting part deforms more easily. When the substrate connecting structure is repeatedly subjected to a rapid temperature change, expansion and contraction of the second substrate connecting part are absorbed through deformation of the second substrate connecting part, so that stress acting on the joint area of the second substrate connecting part and the second substrate is relieved.

In the above aspect, the first substrate may control power supply to an electric device, while the second substrate may supply electricity to the electric device under control by the first substrate.

The substrate connecting structure having this aspect allows electricity to be supplied to a substrate more efficiently.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
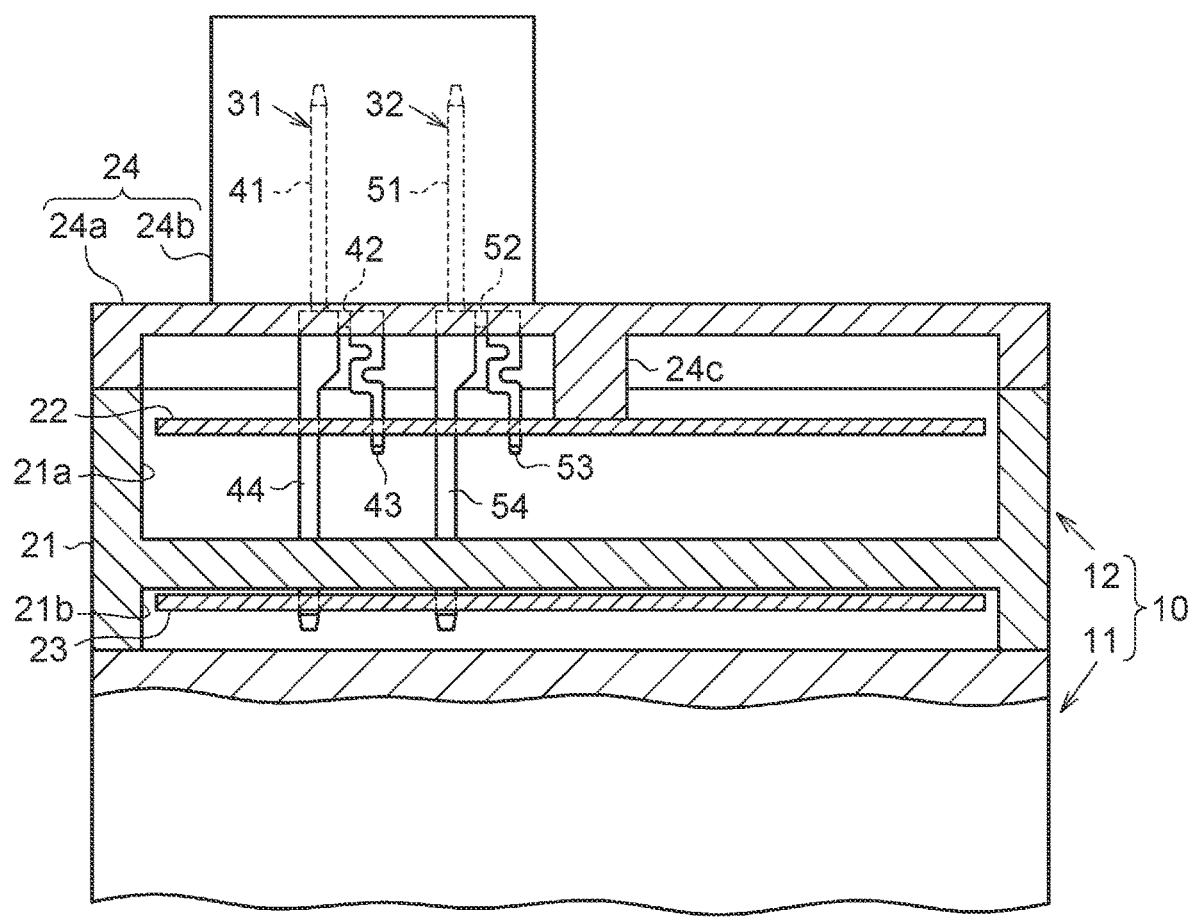
FIG. 1 is a sectional view of a main part of a motor device including one embodiment of a substrate connecting structure.

One embodiment in which a substrate connecting structure is implemented in a motor device will be described below. As shown in FIG. 1, a motor device 10 has a motor 11 and a controller 12. The controller 12 is provided at an end of the motor 11. For example, a three-phase brushless motor is used as the motor 11. The controller 12 controls power supply to the motor 11. The controller 12 has a heatsink 21, a first substrate 22, a second substrate 23, and a cover 24.

The heatsink 21 is fixed to the end of the motor 11. The heatsink 21 is made of a metal material having excellent heat conductivity, such as aluminum. The heatsink 21 has a first substrate housing part 21a and a second substrate housing part 21b. The first substrate housing part 21a opens in a side surface of the heatsink 21 on a side opposite from the motor 11 (the upper side in FIG. 1). The second substrate housing part 21b opens in a side surface of the heatsink 21 on the side of the motor 11 (the lower side in FIG. 1).

The first substrate 22 is a so-called control substrate. The first substrate 22 is housed in the first substrate housing part 21a of the heatsink 21. The first substrate 22 is fixed to the cover 24 to be described later. For example, a microcomputer and various electronic components are provided on the first substrate 22.

The second substrate 23 is a so-called power substrate. The second substrate 23 is housed in the second substrate housing part 21b of the heatsink 21. The second substrate 23 is fixed to an inner bottom surface of the second substrate housing part 21b. For example, an inverter circuit having a plurality of field-effect transistors (FETs) is provided on the second substrate 23.

The cover 24 is mounted on the side surface of the heatsink 21 on the side opposite from the motor 11. The cover 24 is integrally made of a synthetic resin material. The cover 24 has a main part 24a and a connector fitting part 24b. The main part 24a covers and thereby closes the first substrate housing part 21a of the heatsink 21. The first substrate 22 is fixed to an inner bottom surface of the main part 24a through a support 24c. The connector fitting part 24b is provided on a side surface of the main part 24a on a side opposite from the heatsink 21 (an upper surface in FIG. 1). The connector fitting part 24b has a quadrangular tubular shape and opens toward a side opposite from the heatsink 21.

A power supply terminal 31 and a ground terminal 32 are integrally provided inside the connector fitting part 24b. The power supply terminal 31 and the ground terminal 32 are provided side by side along a certain direction (a left-right direction in FIG. 1). The power supply terminal 31 and the ground terminal 32 extend through the main part 24a of the cover 24. A part of the power supply terminal 31 that has passed through the main part 24a has a shape of being split into two prongs, with the two prongs connected respectively to the first substrate 22 and the second substrate 23. Likewise, a part of the ground terminal 32 that has passed through the main part 24a has a shape of being split into two prongs, with the two prongs connected respectively to the first substrate 22 and the second substrate 23.

A plug connector provided at a first end of a wire of which a second end is connected to a direct-current power source, such as a battery, is fitted into the connector fitting part 24b. Each of the first substrate 22 and the second substrate 23 is connected to a plus terminal of the direct-current power source through the power supply terminal 31. Each of the first substrate 22 and the second substrate 23 is connected to a minus terminal of the direct-current power source through the ground terminal 32. In this embodiment, the minus terminal of the direct-current power source is a ground terminal.

Direct-current power as operating power supply is supplied to each of the first substrate 22 and the second substrate 23 through the power supply terminal 31. The microcomputer of the first substrate 22 generates a switching command for the inverter circuit of the second substrate 23 based on a rotation angle of the motor 11 that is detected through a rotation angle sensor. As each FET of the inverter circuit switches based on the switching command generated by the microcomputer, the direct-current power supplied from the direct-current power source is converted into three-phase alternating-current power. The alternating-current power generated by the inverter circuit is supplied to a stator coil of the motor 11 through a power supply path, such as a bus bar.

Figure 2:
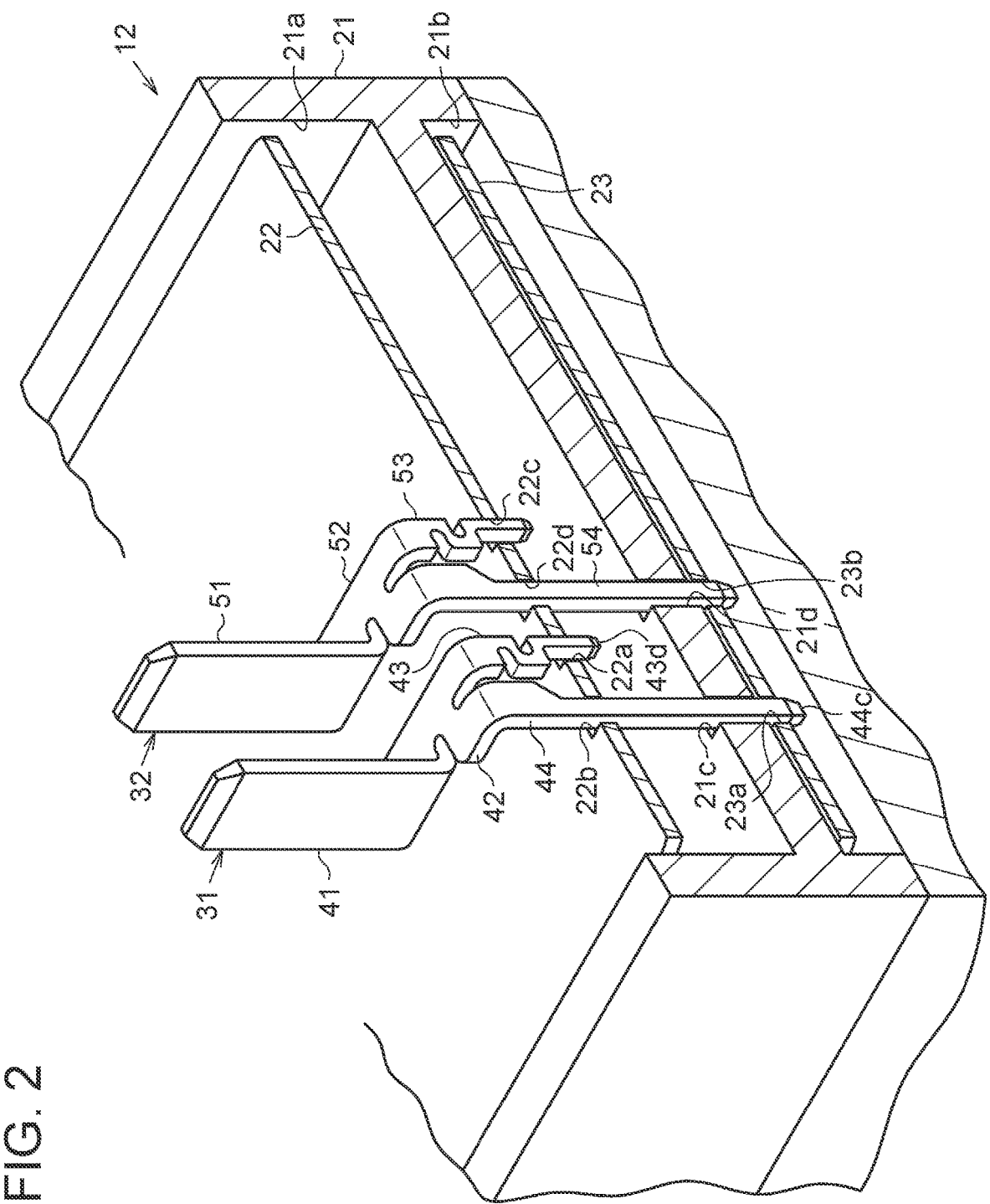
FIG. 2 is a sectional perspective view showing a main part of the substrate connecting structure of the one embodiment.

Next, the power supply terminal 31 will be described in detail. As shown in FIG. 2 with the cover 24 omitted, the power supply terminal 31 is formed by bending a metal plate having a specific contour shape. The power supply terminal 31 has a connector connecting part 41, a coupling part 42, a first substrate connecting part 43, and a second substrate connecting part 44.

The connector connecting part 41 has a rectangular plate shape. The connector connecting part 41 is located inside the connector fitting part 24b (see FIG. 1). The connector connecting part 41 extends along a direction orthogonal to the first substrate 22. The connector connecting part 41 is held in such a posture that a plate thickness direction thereof coincides with the direction in which the power supply terminal 31 and the ground terminal 32 are disposed side by side.

The coupling part 42 is a part that couples together the connector connecting part 41 and the two substrate connecting parts (43, 44). The coupling part 42 has a rectangular plate shape. The coupling part 42 is coupled to an end of the connector connecting part 41 on a side closer to the first substrate 22 (a lower end in FIG. 2). The coupling part 42 is orthogonal to the connector connecting part 41 and parallel to the first substrate 22. The coupling part 42 is embedded inside the main part 24a in such a posture that a plate thickness direction thereof coincides with a plate thickness direction of the first substrate 22 (an up-down direction in FIG. 2). The coupling part 42 extends in a direction orthogonal to the direction in which the power supply terminal 31 and the ground terminal 32 are disposed side by side.

The first substrate connecting part 43 and the second substrate connecting part 44 are connected to an end of the coupling part 42 on a side opposite from the connector connecting part 41. The first substrate connecting part 43 and the second substrate connecting part 44 are orthogonal to the coupling part 42 and extend toward a side opposite from the connector connecting part 41 (the lower side in FIG. 2). The first substrate connecting part 43 and the second substrate connecting part 44 are disposed side by side along the direction in which the power supply terminal 31 and the ground terminal 32 are disposed side by side. The first substrate connecting part 43 and the second substrate connecting part 44 are held in such a posture that plate thickness directions thereof are orthogonal to both the plate thickness direction of the connector connecting part 41 and the plate thickness direction of the coupling part 42.

Figure 3:
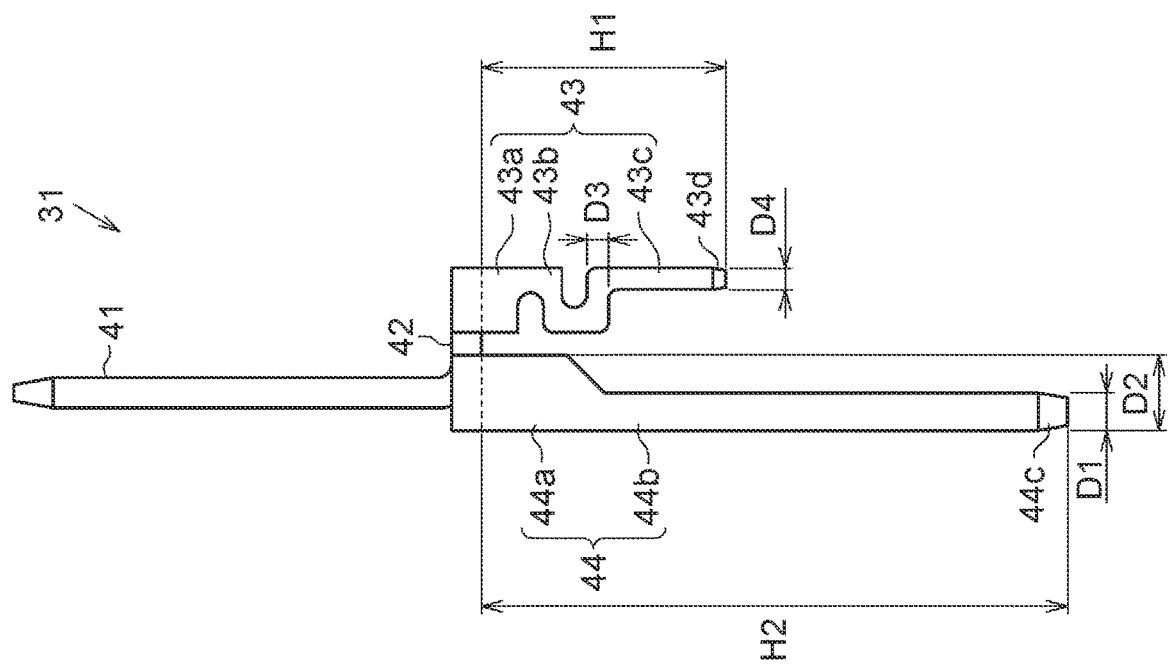
FIG. 3 is a front view of a power supply terminal of the one embodiment.

As shown in FIG. 3, the first substrate connecting part 43 has a base end portion 43a, a serpentine portion 43b, and an insertion portion 43c. The base end portion 43a is a portion of the first substrate connecting part 43 located on the side of the coupling part 42. The serpentine portion 43b is a portion that meanders alternately in opposite directions along the direction in which the first substrate connecting part 43 and the second substrate connecting part 44 are disposed side by side (a left-right direction in FIG. 3). The insertion portion 43c is a portion of the first substrate connecting part 43 located on the opposite side of the serpentine portion 43b from the coupling part 42, and is a portion including a leading end portion 43d that is an end of the first substrate connecting part 43 on the side opposite from the coupling part 42. The insertion portion 43c extends along a direction orthogonal to the direction in which the first substrate connecting part 43 and the second substrate connecting part 44 are disposed side by side (along an up-down direction in FIG. 3). A width D3 of the serpentine portion 43b and a width D4 of the insertion portion 43c are set to the same width.

The second substrate connecting part 44 has a base end portion 44a and an insertion portion 44b. The base end portion 44a is a portion of the second substrate connecting part 44 located on the side of the coupling part 42. The insertion portion 44b is a portion of the second substrate connecting part 44 located on the opposite side of the base end portion 44a from the coupling part 42, and is a portion including a leading end portion 44c that is an end of the second substrate connecting part 44 on the side opposite from the coupling part 42. A width D1 of the insertion portion 44b is set smaller than a width D2 of the base end portion 44a.

A length H1 of the first substrate connecting part 43 from the coupling part 42 is set smaller than a length H2 of the second substrate connecting part 44 from the coupling part 42. As shown in FIG. 2, the leading end portion 43d of the first substrate connecting part 43 is inserted into a first hole 22a provided in the first substrate 22. The leading end portion 44c of the second substrate connecting part 44 is inserted into a hole 23a provided in the second substrate 23 through a second hole 22b provided in the first substrate 22 and a hole 21c provided in the heatsink 21.

Figure 4:
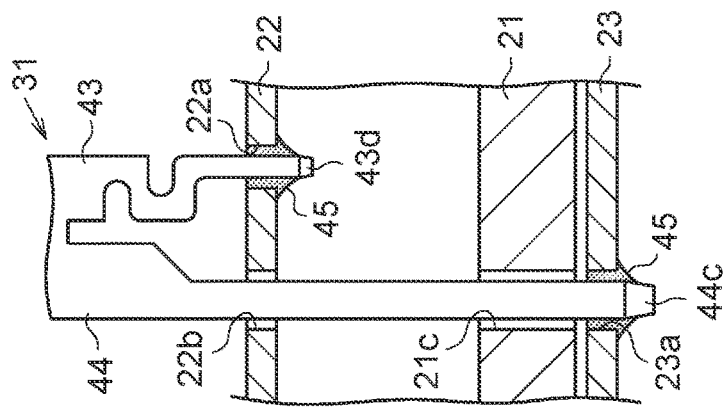
FIG. 4 is a sectional view of a main part showing an area where the power supply terminal and substrates are connected to each other in the one embodiment.

As shown in FIG. 4, the leading end portion 43d of the first substrate connecting part 43 is joined to the first substrate 22 with solder 45 from the side of the first substrate 22 opposite from the cover 24. Thus, the first substrate connecting part 43 and a power supply line in the first substrate 22 are electrically connected to each other. The leading end portion 44c of the second substrate connecting part 44 is joined to the second substrate 23 with solder 45 from the side of the second substrate 23 opposite from the heatsink 21. Thus, the second substrate connecting part 44 and a power supply line in the second substrate 23 are electrically connected to each other.

The ground terminal 32 has the same shape as the power supply terminal 31. Therefore, a detailed description of the ground terminal 32 will be omitted. As shown in FIG. 2, like the power supply terminal 31, the ground terminal 32 has a connector connecting part 51, a coupling part 52, a first substrate connecting part 53, and a second substrate connecting part 54. A leading end of the first substrate connecting part 53 is inserted into a third hole 22c provided in the first substrate 22. A leading end of the second substrate connecting part 54 is inserted into a hole 23b provided in the second substrate 23 through a fourth hole 22d provided in the first substrate 22 and a hole 21d provided in the heatsink 21.

The leading end of the first substrate connecting part 53 is soldered to the first substrate 22 from the side of the first substrate 22 opposite from the cover 24. Thus, the first substrate connecting part 53 and a ground line in the first substrate 22 are electrically connected to each other. The leading end of the second substrate connecting part 54 is soldered to the second substrate 23 from the side of the second substrate 23 opposite from the heatsink 21. Thus, the second substrate connecting part 54 and a ground line in the second substrate 23 are electrically connected to each other.

The first substrate 22, the second substrate 23, the power supply terminal 31, and the ground terminal 32 compose a substrate connecting structure. The motor 11 corresponds to an electric device. Each of the power supply terminal 31 and the ground terminal 32 corresponds to a terminal through which electricity is supplied to the first substrate 22 and the second substrate 23. The serpentine portion 43b functions as a low-rigidity portion for reducing the rigidity of the first substrate connecting part 43. The insertion portion 44b of the second substrate connecting part 44 corresponds to a small-width portion that is a portion at which the width of the second substrate connecting part 44 is set smaller. The insertion portion 44*b* as the small-width portion functions also as a low-rigidity portion for reducing the rigidity of the second substrate connecting part 44.

Figure 5:
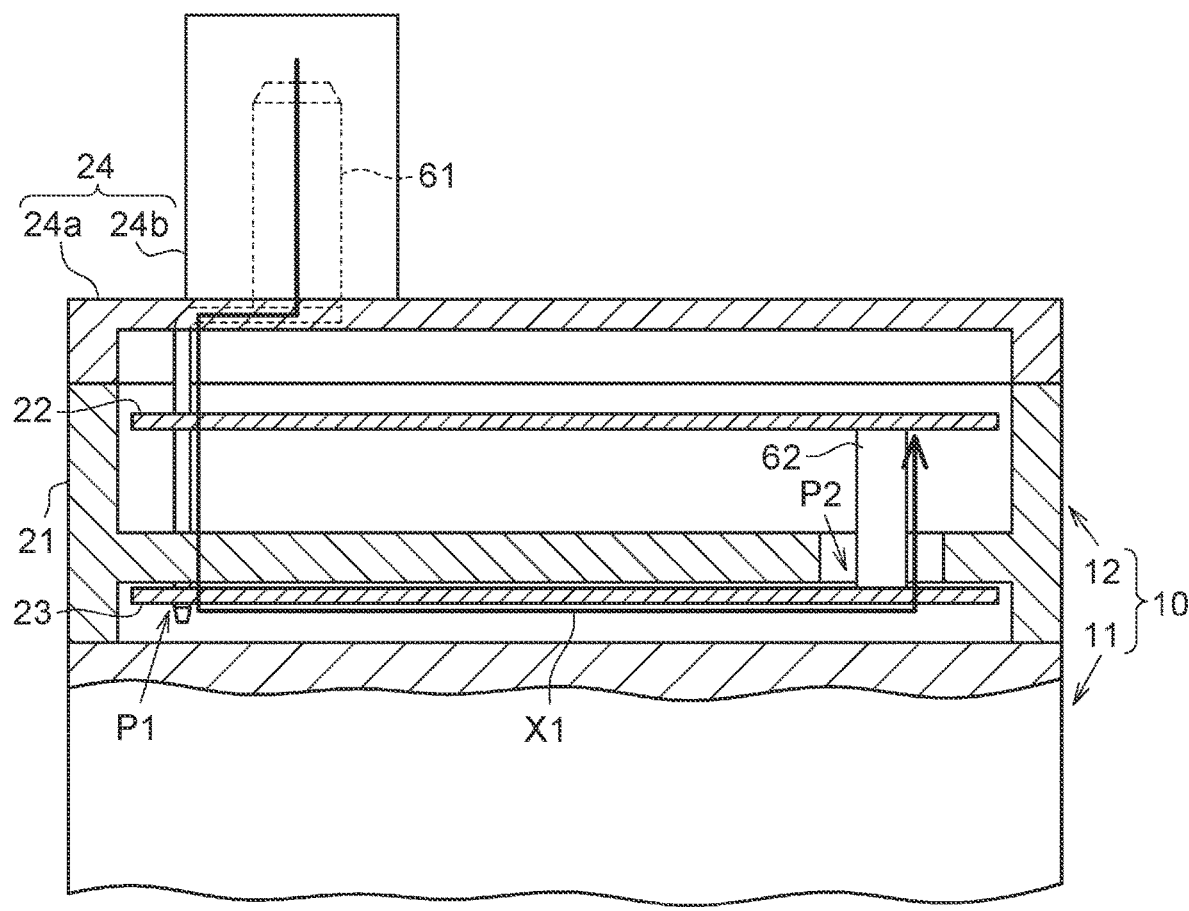
FIG. 5 is a sectional view of a main part of a motor device including a substrate connecting structure of a comparative example.

Next, the workings of the embodiment will be described. Depending on the product specifications etc., the configuration of a comparative example shown in FIG. 5 is conceivable in which electricity is first supplied to the second substrate 23, which is a power substrate, through a power supply terminal 61 that is not split into two prongs, and then is supplied to the first substrate 22, which is a control substrate, through the second substrate 23. In this case, electricity is supplied from the second substrate 23 to the first substrate 22 through, for example, a connecting member 62, such as an inter-substrate connector or a bus bar, that connects the first substrate 22 and the second substrate 23 to each other. However, restrictions on the layout of electronic components in the first substrate 22 and the second substrate 23 and other factors sometimes make it difficult to provide, close to each other, a connection point P1 in the second substrate 23 at which the power supply terminal 61 is connected and a connection point P2 in the second substrate 23 at which the first substrate 22 is connected. For example, a situation is imaginable where the connection point P1 and the connection point P2 are located on the opposite sides of a central part of the second substrate 23.

In the comparative example shown in FIG. 5, as indicated by arrow X1, direct-current power is supplied to the first substrate 22 via the power supply terminal 61, the second substrate 23, and the connecting member 62. Thus, the power supply distance from the power supply terminal 61 to the first substrate 22 tends to be longer. As the power supply distance from the power supply terminal 61 to the first substrate 22 becomes longer, the value of electrical resistance becomes larger. Therefore, as the power supply distance from the power supply terminal 61 to the first substrate 22 becomes longer, the power transmission efficiency may decrease.

In this regard, in the embodiment, the direct-current power from the direct-current power source is directly supplied to both the first substrate 22 and the second substrate 23 through the power supply terminal 31. Of the first substrate connecting part 43 and the second substrate connecting part 44 that are two prongs into which the power supply terminal 31 splits at an intermediate point, the first substrate connecting part 43 is connected to the first substrate 22 from a position near a part of the first substrate 22 that corresponds to the connector fitting part 24*b*, from the direction orthogonal to the first substrate 22. Thus, the power supply distance from the power supply terminal 31 to the first substrate 22 can be further reduced. As the power supply distance becomes even shorter, the value of electrical resistance becomes even smaller. Therefore, the power transmission efficiency increases.

Depending on factors such as the environment where the motor device 10 is installed or used, the ambient temperature of the motor device 10 may change significantly. When the motor device 10 is repeatedly subjected to a rapid temperature change, the following phenomenon may occur in an area where parts with different coefficients of thermal expansion are joined together, for example, the area where the first substrate connecting part 43 of the power supply terminal 31 and the first substrate 22 are joined together by soldering, and the area where the second substrate connecting part 44 of the power supply terminal 31 and the second substrate 23 are joined together by soldering.

When the first substrate connecting part 43 and the first substrate 22 expand and contract accompanying repeated rapid temperature changes, stress acts on the soldered area due to the difference in the rate of expansion between the first substrate connecting part 43 and the first substrate 22, which may result in cracking of the soldered area etc. Likewise, when the second substrate connecting part 44 and the second substrate 23 expand and contract accompanying repeated rapid temperature changes, stress acts on the soldered area due to the difference in the rate of expansion between the second substrate connecting part 44 and the second substrate 23, which may result in cracking of the soldered area etc.

In this regard, the first substrate connecting part 43 is provided with the serpentine portion 43*b*. Thus, compared with when the serpentine portion 43*b* is not provided, the rigidity of the first substrate connecting part 43 decreases and therefore the first substrate connecting part 43 deforms more easily. As expansion and contraction of the first substrate connecting part 43 are absorbed through deformation of the first substrate connecting part 43, stress acting on the joint area of the first substrate connecting part 43 and the first substrate 22 is relieved.

The width of a leading end-side portion of the second substrate connecting part 44 is set smaller than that of a base end-side portion thereof. As the width of the second substrate connecting part 44 is set smaller, the rigidity thereof decreases accordingly and therefore the second substrate connecting part 44 deforms more easily. As expansion and contraction of the second substrate connecting part 44 are absorbed through deformation of the second substrate connecting part 44, stress acting on the joint area of the second substrate connecting part 44 and the second substrate 23 is relieved.

As has been described above, the embodiment can offer the following advantages: Direct-current power from the direct-current power source is directly supplied to the first substrate 22, which is a control substrate, through the power supply terminal 31. Thus, the power supply distance from the power supply terminal 31 to the first substrate 22 can be reduced compared with when electricity from the power supply terminal 31 is supplied to the first substrate 22 through the second substrate 23. As the power supply distance is reduced, the value of electrical resistance decreases accordingly. Therefore, the power transmission efficiency can be increased.

The direct-current power is directly supplied to the first substrate 22 through the power supply terminal 31. Thus, unlike when electricity from the power supply terminal 31 is supplied to the first substrate 22 through the second substrate 23, there is no need for a power supply path for supplying electricity from the second substrate 23 to the first substrate 22.

The first substrate connecting part 43 is connected to the first substrate 22 in the direction orthogonal to the first substrate 22. The second substrate connecting part 44 is connected to the second substrate 23 in the direction orthogonal to the second substrate 23. This makes it basically unnecessary for the first substrate connecting part 43 and the second substrate connecting part 44 to have portions that extend along the first substrate 22 and the second substrate 23. Thus, the power supply distance from the power supply terminal 31 to the first substrate 22 and the power supply distance from the power supply terminal 31 to the second substrate 23 can be further reduced.

The first substrate connecting part 43 is provided with the serpentine portion 43*b* as the low-rigidity portion to reduce the rigidity of the first substrate connecting part 43. Thus, the first substrate connecting part 43 deforms more easily. As expansion and contraction of the first substrate connecting part 43 accompanying repeated rapid temperature changes are absorbed through deformation of the first substrate connecting part 43, stress acting on the joint area of the first substrate connecting part 43 and the first substrate 22 is relieved. Therefore, the first substrate connecting part 43 and the first substrate 22 can be kept in an appropriately joined state.

The second substrate connecting part 44 is provided with, as the low-rigidity portion, the portion at which the width of the second substrate connecting part 44 is set smaller to reduce the rigidity of the second substrate connecting part 44. Thus, the second substrate connecting part 44 deforms more easily. As expansion and contraction of the second substrate connecting part 44 accompanying repeated rapid temperature changes are absorbed through deformation of the second substrate connecting part 44, stress acting on the joint area of the second substrate connecting part 44 and the second substrate 23 is relieved. Therefore, the second substrate connecting part 44 and the second substrate 23 can be kept in an appropriately joined state.

OTHER EMBODIMENTS

The embodiment may be implemented with the following changes made thereto. The first substrate 22 may be a power substrate and the second substrate 23 may be a control substrate.

The second substrate connecting part 44 is provided with, as a structure for reducing its rigidity, the insertion portion 44b that serves as the small-width portion having a smaller width than the base end portion 44a. However, like the first substrate connecting part 43, the second substrate connecting part 44 may be provided with a serpentine portion instead of this small-width portion. This can also reduce the rigidity of the second substrate connecting part 44.

The first substrate connecting part 43 is provided with the serpentine portion 43b as a structure for reducing its rigidity. However, the first substrate connecting part 43 may be provided with, instead of the serpentine portion 43b, a small-width portion that is a portion at which the width of the first substrate connecting part 43 is reduced, as long as the width of the first substrate connecting part 43 can be secured. This can also reduce the rigidity of the first substrate connecting part 43.

Depending on the product specifications, a configuration in which the serpentine portion 43b is omitted from the first substrate connecting part 43 may be employed. Being longer than the first substrate connecting part 43, the second substrate connecting part 44 deforms more easily than the first substrate connecting part 43. Therefore, although it depends on the length of the second substrate connecting part 44, it is not absolutely necessary to provide the second substrate connecting part 44 with a structure for reducing its rigidity (here, a portion at which the width is set smaller). For example, the width D1 of the insertion portion 44b may be set to the same width as the width D2 of the base end portion 44a.

The motor device 10 is suitable as a power source of an electric power steering device. The motor device 10 is also suitable as a source for generating steering reaction force, or a source for generating turning force for turning wheels to be turned, in a steer-by-wire steering device.

The controller 12 may be implemented as a controller of an electric device other than the motor 11.

What is claimed is:

1. A substrate connecting structure comprising:
    a first substrate;
    a second substrate facing the first substrate; and
    a terminal through which electricity is supplied to the first substrate and the second substrate, the terminal including:
        a first substrate connecting part that is connected to the first substrate from a side of the first substrate that is opposite from the second substrate,
        a second substrate connecting part that is formed by splitting from the first substrate connecting part at an intermediate point in the terminal and connected to the second substrate by extending contactlessly through the first substrate from the side opposite from the second substrate toward the second substrate,
        a connector connecting part, and
        a coupling part that couples together the connector connecting part, the first substrate connecting part, and the second substrate connecting part, and the first substrate connecting part and the second substrate connecting part are orthogonal to the coupling part and extend in a direction that is opposite from a direction that the connector connecting part extends.

2. The substrate connecting structure according to claim 1, wherein the first substrate connecting part and the second substrate connecting part extend along a direction in which the first substrate and the second substrate face each other.

3. The substrate connecting structure according to claim 1, wherein, among the first substrate connecting part and the second substrate connecting part, at least the first substrate connecting part is provided with a low-rigidity portion.

4. The substrate connecting structure according to claim 3, wherein:
    a width of the first substrate connecting part connected to the first substrate is smaller than a width of the second substrate connecting part connected to the second substrate; and
    the first substrate connecting part is provided with, as the low-rigidity portion, a serpentine portion that is a portion alternately extending in a serpentine shape in opposite directions.

5. The substrate connecting structure according to claim 3, wherein the second substrate connecting part is also provided with a low-rigidity portion, which is a small-width portion that is a portion at which a width of the second substrate connecting part is set smaller than a remainder of the second substrate connecting part.

6. The substrate connecting structure according to claim 1, wherein the first substrate controls power supply to an electric device, while the second substrate supplies electricity to the electric device under control by the first substrate.

* * * * *